United States Patent [19]

Rosencher et al.

[11] Patent Number: 5,326,984
[45] Date of Patent: Jul. 5, 1994

[54] ELECTROMAGNETIC WAVE DETECTOR

[75] Inventors: Emmanuel Rosencher, Bagneux; Philippe Bois, Cesson, both of France

[73] Assignee: Thomson-CSF, Puteaux, France

[21] Appl. No.: 906,659

[22] Filed: Jun. 30, 1992

[30] Foreign Application Priority Data

Jul. 5, 1991 [FR] France ............... 91 08451

[51] Int. Cl.⁵ .................. H01L 29/205; H01L 29/56; H01L 31/06
[52] U.S. Cl. ...................... 257/21; 257/17; 257/189; 257/449; 257/451; 250/370.14; 250/338.4
[58] Field of Search ............ 257/21, 17, 22, 189, 257/186, 451, 449; 250/370.14, 338.4

[56] References Cited

U.S. PATENT DOCUMENTS

| | | | |
|---|---|---|---|
| 4,194,935 | 3/1980 | Dingle | 257/20 |
| 4,679,063 | 7/1987 | White | 250/370.14 |
| 4,819,036 | 4/1989 | Kuroda et al. | 257/17 |
| 4,862,238 | 8/1989 | Shannon | 257/475 |
| 5,031,013 | 7/1991 | Choi | 257/21 |
| 5,077,593 | 12/1991 | Sato et al. | 257/21 a |
| 5,086,327 | 2/1992 | Rosencher et al. | 257/21 |

FOREIGN PATENT DOCUMENTS

| | | | |
|---|---|---|---|
| 0238406 | 9/1987 | European Pat. Off. | 257/25 |
| 2627013 | 8/1989 | France . | |
| 63-44776 | 2/1988 | Japan | 257/21 |
| 63-155772 | 6/1988 | Japan | 257/20 |

OTHER PUBLICATIONS

Kohn, IEEE Trans. on Elec. Devices, vol. ED-23, No. 2, Feb. 1976 pp. 207-214 "A Charge-Coupled . . . Detectors".
Applied Physics Letters vol. 45, No. 6, Sep. 15, 1984, pp. 649-651, New York, US; D. D. Coon et al. "New mode of IR detection using quantum wells".
Japanese Journal of Applied Physics vol. 27, No. 12, Dec. 1988, pp. L2434-L2437, Tokyo, JP Y. L. Jiang et al. "Field-drifting resonance tunneling through a-Si:H-/a-Si 1-x CX: H double barrier in the p-i-n structure".
Applied Physics Letters, vol. 50, No. 16, Apr. 20, 1987 pp. 1092-1094, New York, US; B. F. Levine et al.: New 10 micrometer infrared detector using intersubband absorption in resonant tunneling GaAlAs superlattices.
Electronics Letters, vol. 25, Nov. 22, 1989, pp. S70-S72 Stevenage, GB; B. F. Levine et al.: "GaAs/AlGaAs Quantum-Well Long-Wavelength Infra-red (LWIR) Detector with a Detectivity comparable to HgCdTe".

Primary Examiner—Jerome Jackson
Attorney, Agent, or Firm—Oblon, Spivak, McClelland, Maier & Neustadt

[57] ABSTRACT

An electromagnetic wave detector comprises a stack of quantum wells included between an ohmic contact and a rectifier junction which may be a barrier ($Al_yGa_{1-y}As$) with a forbidden band width that is greater than that of the barriers of the quantum wells.

19 Claims, 5 Drawing Sheets

ELECTROMAGNETIC WAVE DETECTOR

BACKGROUND OF THE INVENTION

The invention relates to an electromagnetic wave detector, and notably to a detector made of semiconductor materials with quantum well structures.

There are known quantum well based detectors of infra-red radiation using the transitions (a) between bound levels and free levels and (b) between bound levels. Their mode of operation is briefly recalled here below.

A detector of this type is formed by a stack of alternating layers of a small gap semiconductor (SGS) between two large gap semiconductors (LGS) as shown in figure 1a. The energy difference between the bottoms of the conduction bands of the two semiconductors is the "band-offset" $\Delta E$. For example, these two semiconductors may be made of GaAs for SGS and $Al_xGa_{1-x}As$ (where x is between 0 and 1) for LGS. The electrons in such a structure are subjected to a potential well with a depth $\Delta E$ and a width d, where d is the width of the layer of SGS. If the width d is small enough, the energy of the electrons corresponding to the motion perpendicular to the layers is quantified in levels $E_1$, $E_2$ . . . In the bound/free photoconductive layers, the level $E_1$ is bound ($E_1 < \Delta E$) and the level E is unbound or free ($E_2 > \Delta E$). If the level $E_1$ is occupied because of an electron (by doping for example), a photon with energy $h\nu$ greater than $\Delta E - E_1$ causes an optical transition. The electron is then free to move and can be detected as a current at the terminals of the multiple well structure (see figure 1b).

The detector structure is shown then in FIG. 2. It has a stack of doped LGS/SGS/LGS layers sandwiched between two thick and highly doped SGS layers providing the ohmic contact. The device is at a temperature low enough for all the electrons to be trapped in the quantum wells. This current is given by the relationship:

$$J_{th} = J_{tho} e^{-[(\Delta E - E_1) - E_F]/kT} \quad (1)$$

where
T is the temperature
k is the Boltzmann constant,
$E_F$ is the Fermi level of the electrons in the quantum well,
J is the thermionic current given by K. Brennan and Y. Wang in: "Analysis of the Two-Dimensional Dark Currents in Quantum Well Devices", Applied Physics Letter, 57, 1337 (1990).

The response of this photodetector is deduced using the following line of reasoning. The density by volume of carriers is determined by the balance between, firstly, the optical generation:

$$G = \eta \cdot \phi / t$$

where $\eta$ is the quantum yield, $\phi$ the flux of the photons and t the thickness of the quantum well and, secondly, the recombination:

$$R = n/\tau$$

where n is the density by volume of electrons in the conduction band of LGS and $\tau$ is the lifetime of this electron. The density of photo-excited electrons n is given by G=R, i.e.

$$n = \eta \tau \phi / t$$

and the current density by:

$$j = nq\mu E$$

$$j = q\eta\tau\phi\mu E/t \quad (2)$$

where $\mu$ is the mobility of the electrons in the LGS and E is the applied electrical field. The response R of the structure is given by:

$$R = j/\phi h\nu = q\eta\mu E/th\nu$$

It is observed that, for a constant electrical field, this response is independent of the number of wells. The invention relates to a device in which the response is a growing response when the number of wells increases. The response is then increased, and this increases the detectivity.

SUMMARY OF THE INVENTION

The invention therefore relates to an electromagnetic wave detector comprising a stack of layers of different materials having different forbidden gap widths, so as to constitute a stack of quantum wells, wherein the stack of layers is included between an ohmic contact and a rectifier junction.

BRIEF DESCRIPTION OF THE DRAWINGS

The different objects and features of the invention shall appear from the following description and from the appended drawings, of which.

DETAILED DESCRIPTION OF THE INVENTION

Figure 1A:
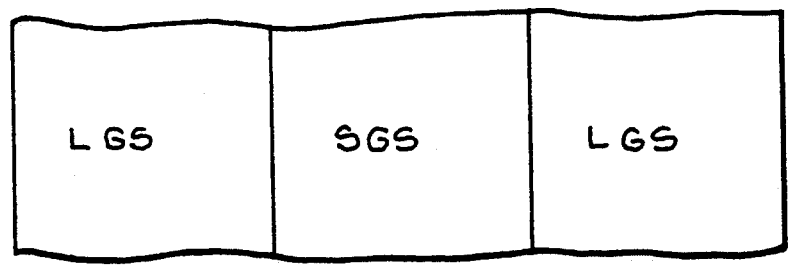
FIGS. 1a, 1b and 2 show detection devices known in the prior art.
Figure 1B:
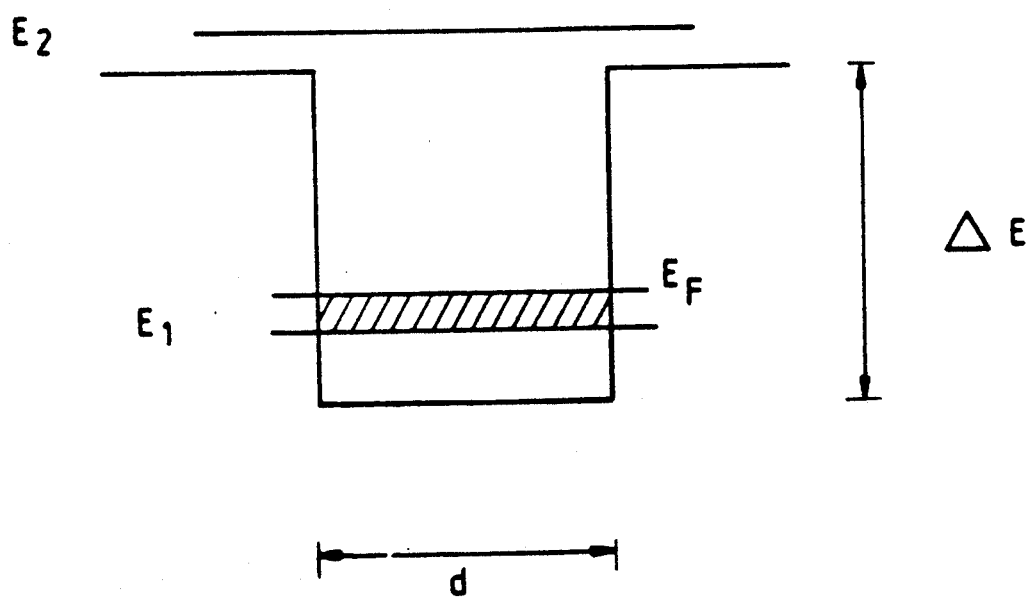
Figure 2:
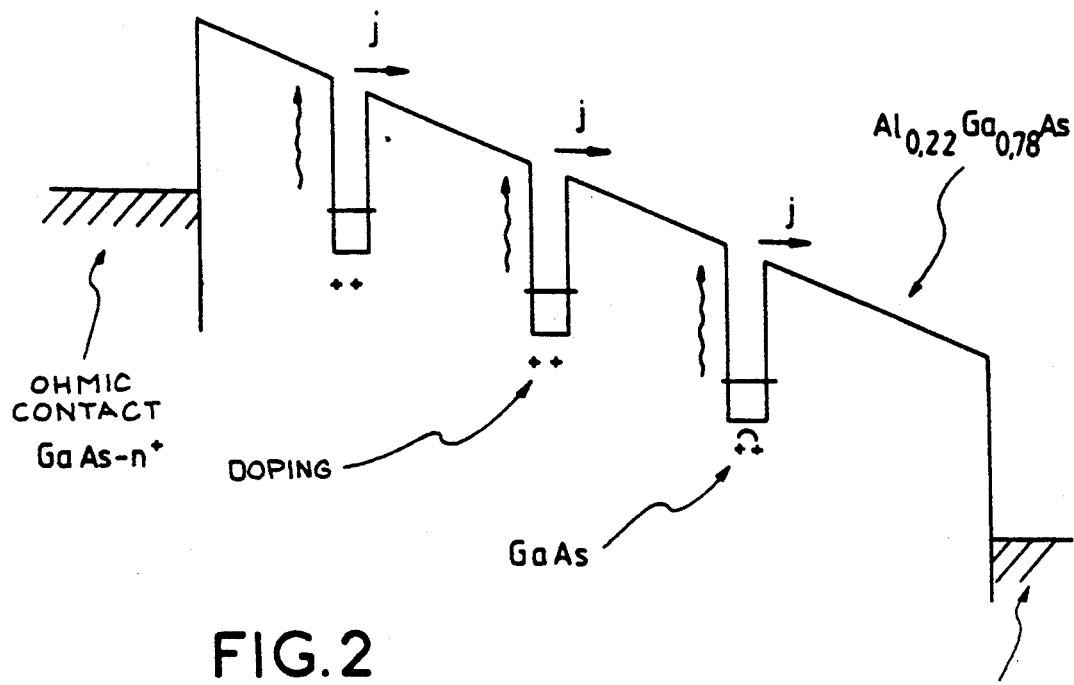
Figure 3:
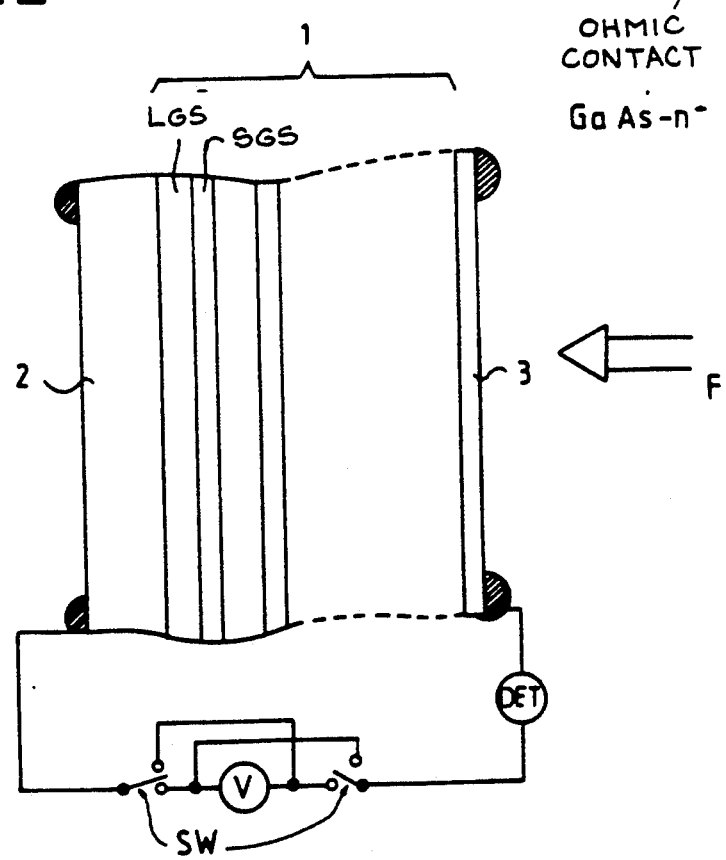
FIG. 3 shows a general exemplary embodiment of a device according to the invention.

There is thus provided a structure as shown in FIG. 3, comprising a stack of quantum wells 1 constituted by large gap semiconductor (LGS) layers and small gap semiconductor (SGS) layers such that:

$$\Delta E - E_1 = h\nu$$

where:
$\Delta E$ is the band offset between the conduction band bottoms of the two materials;
$E_1$ is the value of the energy of the first permitted level of the SGS layers;
$h\nu$ is the energy of a photon to be detected.

The stack of quantum wells is provided, on one side, with a current rectifier junction 2 and, on the other side, with an ohmic contact 3.

A DC voltage generator is connected to the junction 2 and to the ohmic contact by a reversal system SW enabling the voltage applied to be reversed.

Figure 4:
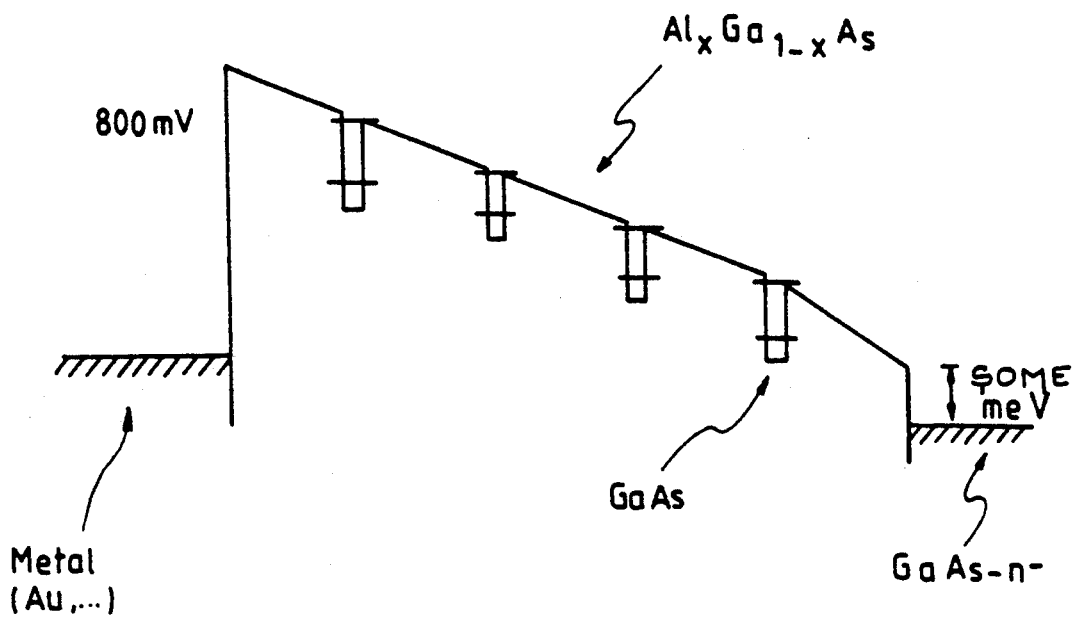
FIG. 4 shows a detailed view of an exemplary embodiment of a device according to the invention.

As shown in greater detail in FIG. 4, the structure according to the invention can be made, for example, as follows:

SGS layers (quantum wells) made of GaAs with a thickness d=approximately 6 nm;

LGS layers (barriers) $Al_yGa_{1-x}As$ (with x=0.22 for example) with a thickness L=approximately 30 nm.

We then have $\Delta E - E_1 = 120$ meV, and it is possible to detect waves at 10.6 µm wavelengths.

The ohmic contact is a layer with a nature similar to that of the SGS layers and has n+doping. It is made of GaAs—n+ for example.

The rectifier junction may be a Schottky type barrier, which gives the following structure:

$Metal/Al_xGa_{1-x}As/GaAs/Al_xGa_{1-x}As/\ldots$
$/Al_xGa_{1-x}As/GaAs\ n+$

Figure 5:
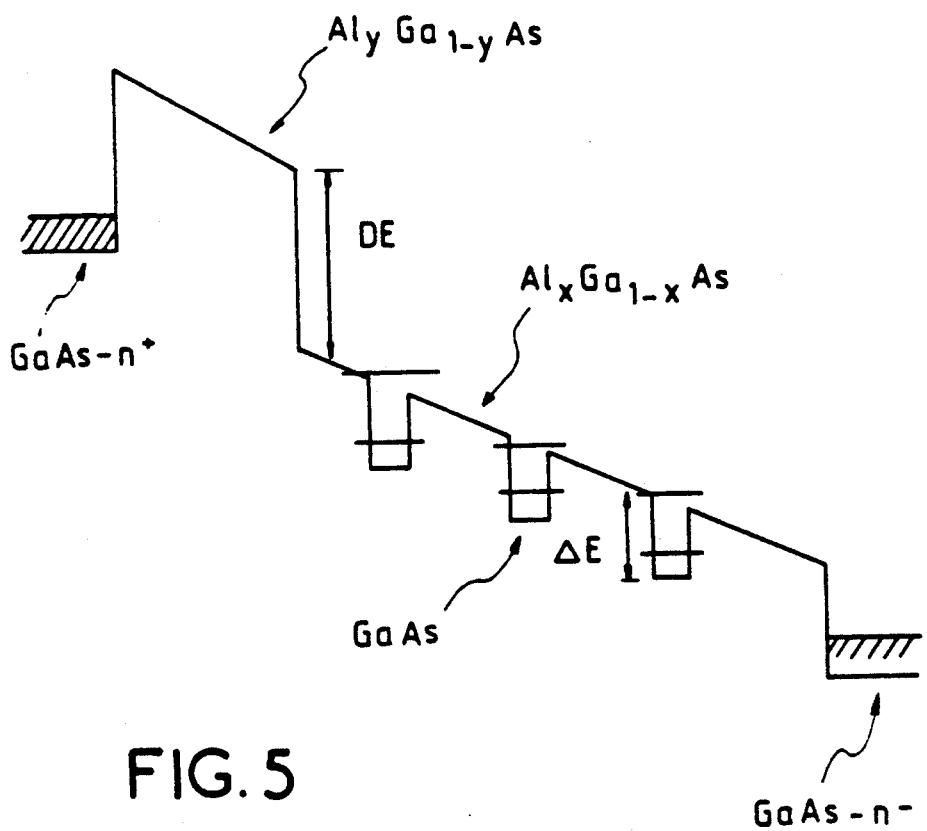
FIG. 5 shows an alternative embodiment of a device according to the invention.

FIG. 5 shows an alternative embodiment in which the rectifier junction has a barrier, the height DE of which is substantially greater than $\Delta E$. For example, this barrier may be made of $Al_yGa_{1-x}As$ with y greater than the value of x provided in the composition of the $Al_y$-$Ga_{1-x}As$ barriers. The structure therefore has the following configuration:

$GaAs-n+/Al_yGa_{1-y}As/Al_xGa_{1-x}As/GaAs/\ldots$
$/GaAs-n+$

Hereinafter, we shall explain the latter type of structure and shall consider, by way of an example, that y=0.4.

Figure 6A:
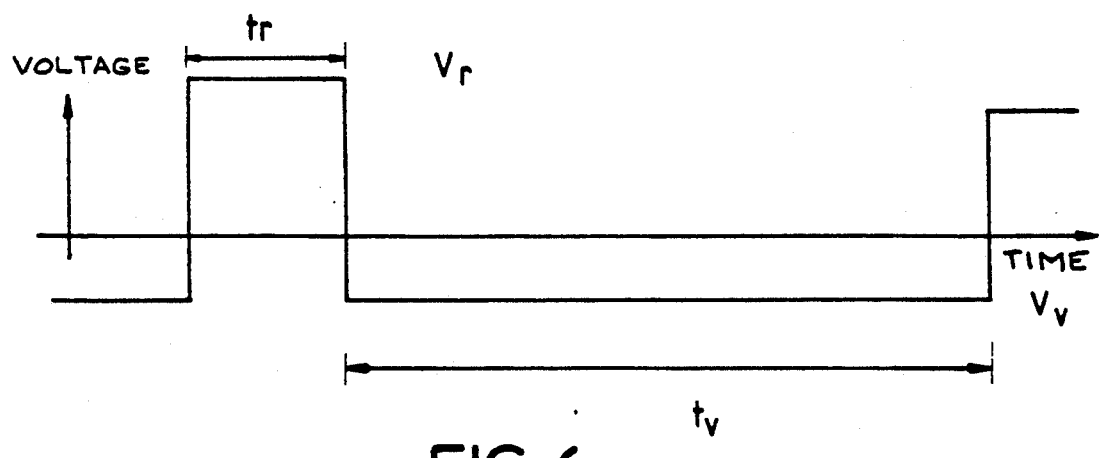
FIGS. 6a to 6c show energy diagrams explaining the working of the device according to the invention.
Figure 6B:
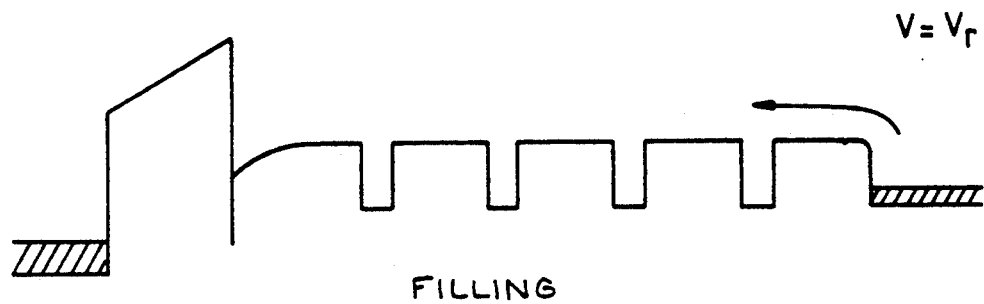
Figure 6C:
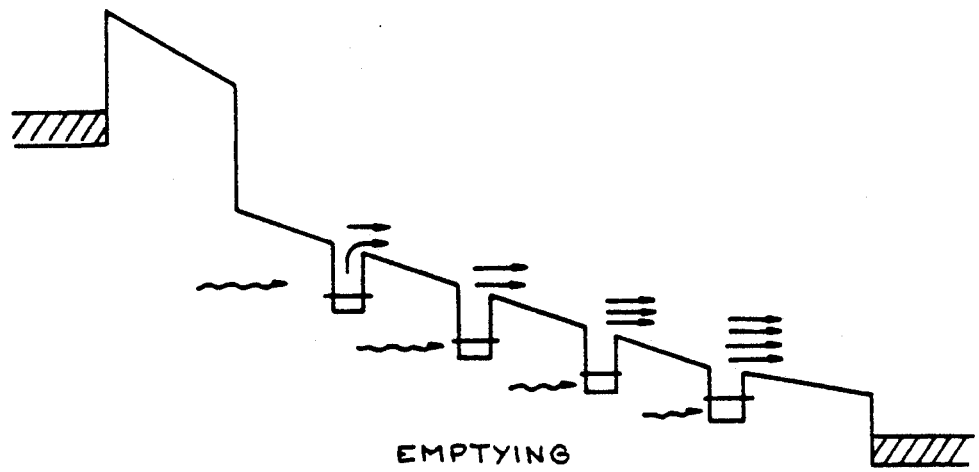

In this structure, the static current J is dominated by the $GaAs-n+/Al_{0.40}Ga_{0.6}As$ junction which has a barrier height $DE>>E$. This current is given by the relationship:

$$J_f = A^* T^2 e^{-q \cdot DE/kT}$$

where $A^*$=Richardson's Constant. Since $DE>\Delta E$, it is seen that, for equal temperature, the static current is far smaller in this structure than in the known structures. This structure is then subjected to potential pulses as shown in FIG. 6a. During a period of time $t_R$, a bias $V_R$ is applied which is such that the quantum wells are filled by the ohmic contact. During a period of time $t_v$, a reverse bias is applied. If no photon is incident, the structure is dominated by the thermal emission of the electrons. This rate of emission $e_n$ is given by 5.

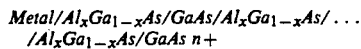

where:
$\sigma$ is the effective capture cross-section.
$v_{th}$ is the thermal speed of the carriers,
$N_c$ is the effective density in the conduction band of $Al_xGa_{1-x}As$.

The term $e_n$ of this equation can be approximately related to the current $J_{th}$ of equation (1) by the relationship:

$$J_{th} = n_0 \cdot q \cdot e_n$$

where $n_0$ is the doping of the wells.

It is therefore important to note that the conditions needed to have a weak dark current in a photoconductor are very close to those needed to have a high time constant for the thermal emission. For example, if it is sought to use a structure according to the invention for a video detection (e<24 s$^{-1}$), then:

$$J_{th} = <\cdot 10^{12} \times 10^{-19} \times 24 \times 1.6$$

giving $J_{th} < 3.6 \times 10^{-6} A/cm^2$

The number of electrons n(t) in each well under illumination is given by the equation:

$$dn(t)/dt = -\sigma_{op} \cdot n(t) \phi$$

where $\sigma_{op}$ is the effective optical cross-section of the well. Then $$n(t) = n_0 e^{\sigma_{op} \phi t}$$

and the quantity of charges detected is then, assuming that all the photo-emitted electrons are detected:

$$Q(t) = qNn_0(1 - e^{-\sigma_{op} \phi t})$$

N is the number of quantum wells. The detected current is then:

$$i_T(t) = qNn_0 \sigma_{op} \phi e^{-\sigma_{op} \phi t}$$

The detected signal is therefore proportional to the number of quantum wells unlike in the prior art photodetector case.

For example the typical effective optical cross-section values are $5 \times 10$ cm$^{-15}$ cm$^2$. For reading times of 1/24th second, the response remains linear for $$\sigma_{op} \phi < 24 \text{ that is, for } \phi > 1.10^{15}$$

which is a very high $\phi$ (about 50 µw for 100 meV photons). In this case $$i_T = qNn_0 \sigma_{op} \phi \quad (3)$$

It is recalled that, in the known devices, the photoconductor current is given by the equation (2).

If we compare the current $i_T$ to the current J of the equation (2), it is shown that:

$$i_T/J = t/\tau vE = t/\lambda$$

This is the reverse of the photoconduction gain. For a thickness t=5 µm, a product µτ of $1.20^{-9}$ V.cm$^{-2}$ and E=$10^4$ V/cm, this reverse gain has a value of 25. A gain such as this will enable the device to be made to work at higher temperatures.

Figure 7:
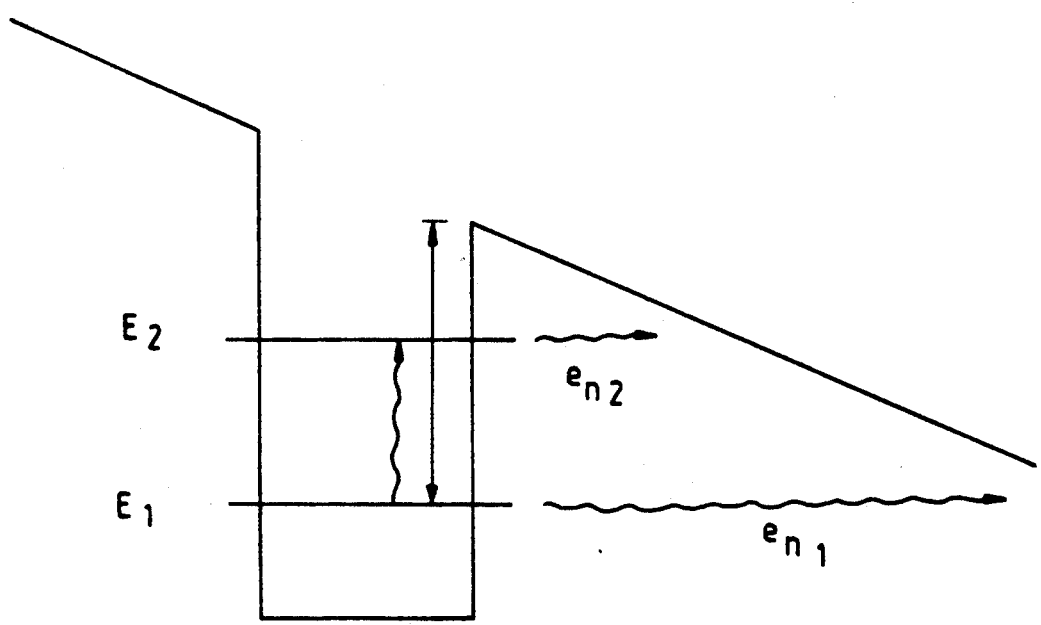
FIGS. 7 and 8 show an operation of the device according to the invention in bound/bound levels mode.

Another configuration of this blocking electrode entails its use for bound-bound transitions, i.e. when the level $E_2$ is inside the well (FIG. 7). It is known that it then becomes necessary, in the quantum well photoconductors, to bring the wells sufficiently close to one another to enable the tunnel conduction from one well to another, thus increasing the dark current and hence causing deterioration in the detectivity. In the transient operation using a blocking electrode, the conduction by tunnel effect between wells can be avoided. This time, it is enough for the probability of emission by tunnel effect to be high enough to short-circuit the recombination between sub-bands. This period of time is of the order of ten picoseconds. It is therefore enough to apply an electrical field such that the tunnel time at the second level is lower than 10 ps.

Two conditions should therefore be met:

Condition 1: $e_{FN}(\Delta E) < 24 \, s^{-1}$

Condition 2: $e_{FN}(\Delta E - h\nu) > 10^{11} \, s^{-1}$ $e_{FN}$ is the rate of emission by tunnel effect assisted by the electrical field, or the Fowler-Nordheim effect.

Figure 8:
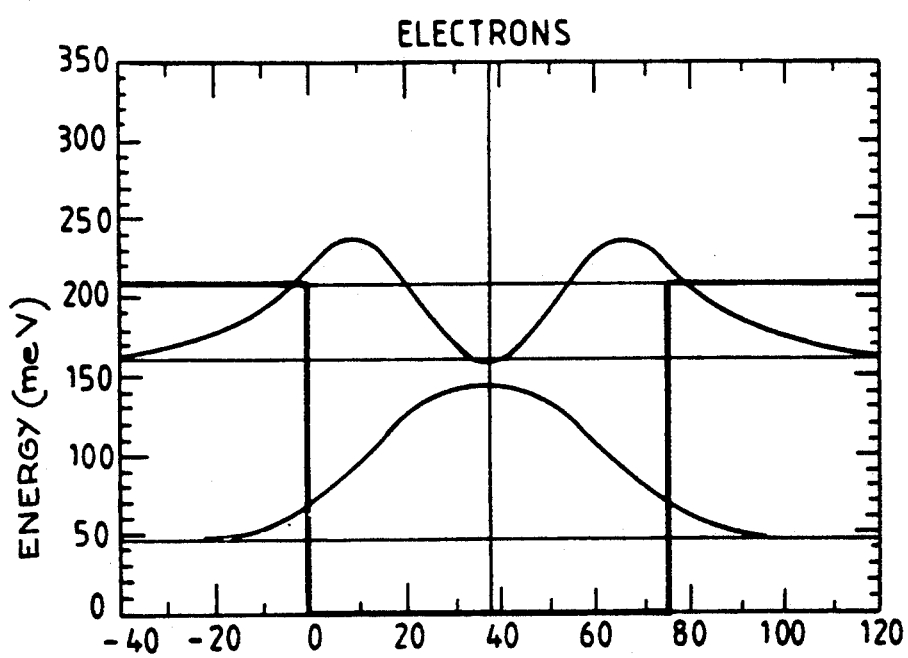

Condition 1 means that the rate of emission is far lower than the video frequency and condition 2 ensures that, nonetheless, the electron on the excited state will come out of the well before getting recombined at the fundamental level. An example fulfilling both these conditions is given in FIG. 8.

In this example, the aluminium percentage in the barrier is about 25%.

Size of well: 7.5 nm.

This well absorbs at 10.6 μm and can work up to 100 K.

The bias and reading circuits of such pulse devices would be equivalent to the circuits used in the prior art in Si:Ga detectors with blocked impurities band.

It is quite clear that the above description has been given purely by way of a non-restrictive example and that other variants may be contemplated without going beyond the scope of the invention. Notably, the compositions of the layers of materials and their thicknesses may be different from those indicated here above.

What is claimed is:

1. An electromagnetic wave detector, comprising:
   a stack of layers of different materials having different forbidden band gaps, so as to constitute a stack of quantum wells, the stack of layers having first and second major surfaces and an ohmic contact on the first major surface and a rectifying junction on the second major surface; and
   means for applying a voltage of alternating polarity across the ohmic contact, the stack of layers, and the rectifying junction.

2. An electromagnetic wave detector for detecting electromagnetic waves having a first photon energy, comprising:
   a semiconductor superlattice structure;
   a current detector;
   a voltage source;
   a switching network;
   wherein the semiconductor superlattice structure and the current detector are coupled in series with one another and the switching network is operable to couple the voltage source in series with the semiconductor superlattice structure in either of a first polarity or a second polarity; and
   wherein the semiconductor superlattice structure comprises a plurality of quantum wells wherein each of the plurality of quantum wells has at least a first bound energy level and the energy of the first bound energy level in each of the quantum wells is the same; and
   wherein one side of the stack of quantum wells is contacted with an ohmic contact and the opposite side of the stack of quantum wells is contacted with a rectifying junction.

3. An electromagnetic wave detector according to claim 2, wherein:
   a substantial portion of the surface of the semiconductor superlattice structure which is contacted by said ohmic contact is exposed so that a source of radiation having the first wavelength may be transmitted into the ohmicly contacted surface.

4. An electromagnetic wave detector according to claim 2, wherein the switching network further comprises means for periodically switching at a first frequency.

5. An electromagnetic wave detector according to claim 4, wherein the first frequency is about 24 Hz.

6. An electromagnetic wave detector according to claim 2, wherein the rectifying junction comprises a Schottky diode.

7. An electromagnetic wave detector according to claim 2, wherein the rectifying junction comprises a layer of semiconductor material which has a forbidden bandgap that is substantially greater than the forbidden bandgap of semiconductor material forming the plurality of quantum wells.

8. An electromagnetic wave detector according to claim 7, wherein:
   the rectifying junction comprises the same elemental constituents as occur in the semiconductor superlattice structure.

9. An electromagnetic wave detector according to claim 2, wherein the plurality of quantum wells comprises repeating units of layers of aluminum gallium arsenide and gallium arsenide stacked upon one another.

10. An electromagnetic wave detector according to claim 9, wherein the rectifying junction comprises a layer of aluminum gallium arsenide with a higher aluminum concentration than any of the layers forming the plurality of quantum wells.

11. An electromagnetic wave detector according to claim 2, wherein each of the plurality of quantum wells has a second bound energy level at an energy which is greater than the energy of the first bound energy level and wherein when the semiconductor superlattice structure is biased by the voltage source so that the ohmic contact to the semiconductor superlattice structure is at a lower potential energy than the opposite end of the semiconductor superlattice structure wherein the rate of electric field assisted tunneling from any of the first energy levels is less than about 1/24 per second and the rate of electric field assisted tunneling from any of the second energy levels is greater than $10^{11}$ per second.

12. An electromagnetic wave detector according to claim 2, wherein the average electric field in the semiconductor superlattice structure is about $10^4$ V/cm.

13. An electromagnetic wave detector according to claim 2, further comprising:
   a source of electromagnetic radiation whose photons have an energy equivalent to the energy difference between the conduction band edges forming the quantum wells minus the energy of the first bound energy level.

14. An electromagnetic wave detector according to claim 11, further comprising:
   a source of electromagnetic waves disposed so that electromagnetic waves produced thereby are directed toward the surface of the stack of the semiconductor superlattice structure having said ohmic contact thereon and wherein the photon energy of the source of electromagnetic waves is equal to the difference in energy between the first and second bound energy levels.

15. A process for detecting electromagnetic energy whose photons have a first wavelength, comprising the steps of:
   connecting a semiconductor superlattice structure comprising a plurality of quantum wells which each have at least a first bound energy level and which are stacked upon one another and having a rectifying junction at one end of the stack and an ohmic contact at the other end of the stack in series with a current detector and with a voltage source, said voltage source being coupled to the current detector and the semiconductor superlattice structure through a polarity reversing switching network;

directing electromagnetic radiation at the semiconductor superlattice structure; and repeatedly switching the polarity of the voltage source in order to fill up the first bound energy level of the plurality of quantum wells with electrons when a first polarity is applied to the semiconductor superlattice structure and in order to generate a current which is proportional to the number of quantum wells of the semiconductor superlattice structure and to radiation having a first wavelength when a second polarity of the voltage source is subsequently connected to the semiconductor superlattice structure.

16. A method according to claim 15, wherein each of the plurality of quantum wells has only one bound energy level.

17. A method according to claim 15, wherein each of the plurality of quantum wells has both a first bound energy level and a second bound energy level;

switching between the first and second polarities at a first rate; and wherein the electric field assisted tunneling rate from each of the first energy levels is less than the first rate and the electric field assisted tunneling rate from each of the second energy levels is greater than $10^{11}$ per second.

18. A method according to claim 17, further comprising the step of applying a voltage to the supperlattice structure.

19. A method according to claim 17, wherein the average electric field in the semiconductor superlattice structure is about $10^4$ V/cm.

* * * * *